United States Patent
Tsironis

(10) Patent No.: US 11,137,439 B1
(45) Date of Patent: Oct. 5, 2021

(54) HYBRID LOAD AND SOURCE TUNER USING DIGITAL ACTIVE LOOP

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/105,143

(22) Filed: Aug. 20, 2018

(51) Int. Cl.
*G01R 31/28* (2006.01)
*G01R 35/00* (2006.01)

(52) U.S. Cl.
CPC ....... *G01R 31/2822* (2013.01); *G01R 35/005* (2013.01)

(58) Field of Classification Search
CPC .... G01R 31/2822; G01R 27/06; G01R 27/28; G01R 27/32; G01R 31/2612; G01R 31/2614; G01R 35/005; G01R 31/62; H01P 5/04; H01P 1/383; H01P 5/18; H01P 1/184; H01P 7/10; H01P 1/15; H03H 11/30; H03H 7/40; H03H 7/383; H03H 11/245; H03H 7/18; H03H 7/24; H03H 7/255; H03H 17/0291; H03H 2210/025; H03H 7/185; H03H 5/02; H03H 7/12; H03J 1/00; H03J 1/06; H05H 1/46; H05H 2001/4622; H05H 2001/463; H05H 2001/4682; H05H 2240/10; H05H 2240/20; H05H 7/22; H05H 2001/4645; H05H 2245/1225; H05H 9/02; H05H 1/18; H03F 3/195; H03F 3/245; H03F 1/0211; H03F 2200/102; H03F 2200/105; H03F 2200/27; H03F 2200/321; H03F 2200/336; H03F 2200/414; H03F 2200/451; H03F 3/24; H03F 1/0288; H03F 2200/387; H03F 1/56; H03F 2200/111; H03F 2200/198; H03F 2200/204; H03F 2200/378; H03F 2200/423; H03F 2200/543; H03F 3/265; H03F 3/602; H03F 1/565; H03F 2200/192; H03F 3/211; H03F 3/60
See application file for complete search history.

(56) References Cited

U.S. PATENT DOCUMENTS

| | | | |
|---|---|---|---|
| 5,276,411 A | 1/1994 | Woodin et al. | |
| 6,515,465 B2 * | 2/2003 | Kiyokawa | G01R 31/2603 324/642 |
| 6,639,393 B2 | 10/2003 | Tasker et al. | |

(Continued)

OTHER PUBLICATIONS

Load Pull, online, Wikipedia [Retrieved on Aug. 24, 2017]. Retrieved from Internet <URL: http://en.wikipedia.org/wiki/Load_pull>.

(Continued)

*Primary Examiner* — Vinh P Nguyen

(57) ABSTRACT

A digitally controlled hybrid (active-passive) tuning system includes a passive slide screw tuner using a slabline in which also fixed and adjustable signal couplers (wave-probes) are mounted, leading to and from an active feedback loop, digitally controlled using an electronic tuner. The wave-probes control the static amplitude and phase of the feedback signal and the electronic tuner controls the actual dynamic (high speed) amplitude and phase of the re-injected signal. The slide screw tuner serves as an additional static pre-matching for reducing the required feedback injection power. Appropriate passive and active calibration and search routines allow identifying tuner states satisfying DUT parameter targets.

5 Claims, 16 Drawing Sheets

(56) References Cited

U.S. PATENT DOCUMENTS

| | | | |
|---|---|---|---|
| 7,135,941 B1 | 11/2006 | Tsironis | |
| 7,282,926 B1 | 10/2007 | Verspecht et al. | |
| 7,449,893 B1* | 11/2008 | Tsironis | G01R 27/32 324/623 |
| 8,410,862 B1* | 4/2013 | Tsironis | H01P 5/04 333/17.3 |
| 8,497,689 B1* | 7/2013 | Tsironis | G01R 27/32 324/642 |
| 8,841,922 B2* | 9/2014 | Ghannouchi | G01R 27/32 324/605 |
| 9,331,670 B1* | 5/2016 | Mahmoudi | G01R 31/2822 |
| 9,431,999 B1* | 8/2016 | Tsironis | H03J 1/06 |
| 9,921,253 B1 | 3/2018 | Tsironis | |
| 10,103,713 B1* | 10/2018 | Tsironis | H03J 1/06 |
| 10,345,370 B1* | 7/2019 | Tsironis | G01R 31/2614 |
| 10,451,702 B1* | 10/2019 | Tsironis | G01R 35/005 |
| 10,520,541 B1* | 12/2019 | Tsironis | G01R 31/2841 |
| 10,725,094 B1* | 7/2020 | Tsironis | G01R 27/32 |
| 2013/0321092 A1* | 12/2013 | Simpson | G01R 27/00 333/17.3 |

OTHER PUBLICATIONS

"Computer Controlled Microwave Tuner, CCMT", Product Note 41, Focus Microwaves Inc., Jan. 1998, pp. 2-4.

"Measurement of Impedance Tuner", presentation by Yangping Zhao, Polytechnique de Montreal, Mar. 2014.

PIN diode [online], Wikipedia [retrieved on Jun. 10, 2018]. Retrieved from Internet <URL: https://en.wikipedia.org/wiki/PIN_diode>.

Varicap [online], Wikipedia [retrieved on Feb. 10, 2018]. Retrieved from Internet <URL:https://en.wikipedia.org/wiki/Varicap>.

Microelectromechanical systems, [online], Wikipedia [retrieved on Jun. 11, 2018]. Retrieved from Internet <URL:https://en.wikipedia.org/wiki/Microelectromechanical_systems>.

"Multi Port Measurements", presentation by D.Blackham and K. Wong, Agilent Technologies, pp. 4 and 9.

* cited by examiner

HYBRID LOAD AND SOURCE TUNER USING DIGITAL ACTIVE LOOP

PRIORITY CLAIM

Not applicable.

CROSS-REFERENCE TO RELATED ARTICLES

1. Load Pull, online, Wikipedia [Retrieved on 2017 Aug. 24]. Retrieved from Internet <URL: http://en.wikipedia.org/wiki/Load_pull>.
2. "Computer Controlled Microwave Tuner, CCMT", Product Note 41, Focus Microwaves Inc., January 1998, pages 2-4.
3. Verspecht et al., U.S. Pat. No. 7,282,926: "Method and an apparatus for characterizing a high-frequency device-under-test in a large signal impedance tuning environment".
4. Woodin et al., U.S. Pat. No. 5,276,411, "High power solid state programmable load".
5. "Measurement of Impedance Tuner", presentation by Yangping Zhao, Polytechnique de Montreal, March 2014.
7. Tasker et. al., U.S. Pat. No. 6,639,393, "Methods and apparatus for time-domain measurement with a high frequency circuit analyzer".
8. PIN diode [online], Wikipedia [retrieved on 2018 Jun. 10]. Retrieved from Internet <URL:https://en.wikipedia.org/wiki/PIN_diode>.
9. Varicap [online], Wikipedia [retrieved on 2018 Feb. 10]. Retrieved from Internet <URL:https://en.wikipedia.org/wiki/Varicap>.
10. Microelectromechanical systems, [online], Wikipedia [retrieved on 2018 Jun. 11]. Retrieved from Internet <URL:https://en.wikipedia.org/wiki/Microelectromechanical_systems>.
11. "Multi Port Measurements", presentation by D. Blackham and K. Wong, Agilent Technologies, pages 4 and 9.
12. Tsironis C., U.S. Pat. No. 9,921,253, "Method for reducing power requirements in active load pull system, FIG. 6.
13. Tsironis C., U.S. Pat. No. 7,135,941, "Triple Probe Automatic Slide Screw Load Pull Tuner and Method".

BACKGROUND OF THE INVENTION AND PRIOR ART

This invention relates to Non-50 Ohm load and source pull (see ref. 1) testing of microwave transistors (DUT). Load/source pull is a method by which the load impedance presented to the DUT at a given frequency is changed systematically and the DUT performance is registered, with the objective to find an optimum depending on the overall amplifier design objectives, such as maximum power, efficiency, linearity or else, and also determine the associated source and load impedances to be presented to the transistor (DUT).

A load/source pull test system is shown in FIG. 1. It comprises a signal source, source and load impedance tuners, a device under test (DUT, transistor) in a test fixture or in form of a micro-chip on a semiconductor wafer, connected using microscopic wafer probes; and input and output measurement instruments. The instruments can measure power, DC bias and various spectral components, generated either by the source and modified by the DUT, or by the non-linearities of the DUT itself. The tuners and the instruments are controlled by a PC controller using appropriate digital communication protocols (GPIB, RS 232, LAN etc.). The data acquired by the test software comprise RF and DC response of the DUT to input stimulus for given source and load impedances. This data are saved in load pull files and serve to (a) qualify the DUT regarding some target specifications and (b) design optimum source and load matching networks for given target performance, this being output power, linearity, efficiency etc.

The load pull setup of FIG. 1 is a classical scalar setup: the injected (available) input power is measured using the directional coupler. The power delivered by the output tuner to the load is measured using the output power meter. No reflected powers or signal phase information can be measured. The tuners are pre-calibrated and the measurement accuracy depends on their mechanical repeatability. Mechanical precision is therefore crucial. The load pull setup of FIG. 9 is different: Hereby bi-directional couplers (input and output coupler) are inserted between the tuners and the DUT. The method is called "wave load pull", because the couplers allow measuring the forward <a> and backward <b> travelling waves, <a1> and <b1> at the input port and <a2> and <b2> et the output port of the DUT; or we know the reflected power wave at the input of the DUT <b1> and the power reflected from the load <a2>; this allows calculating the input reflection factor ($\Gamma_{IN}$=<b1>/<a1>) as well as the in-situ source reflection factor ($\Gamma_{Source}$=<a1>/<b2>) and the load reflection factor ($\Gamma_{Load}$=<a2>/<b2>), without relying on the mechanical repeatability of the passive tuners. In the case of active or hybrid systems the wave load-pull method is mandatory, since active systems, depend on the linearity of the feedback amplifiers, which can change with the processed power and cannot be pre-calibrated, except for using for some kind of pre-tuning; in this case the tuners are set in the rough area of the targets, using calibration data, and then, during the actual measurement, the effective impedances are measured using the couplers in FIG. 9 and saved.

Passive slide-screw tuners (see ref. 2) are popular in the industry for non-50 Ohm measurements. The established technology is the "slide screw tuner", which uses a slotted airline (slabline) and a number of metallic, wideband reflective probes inserted in, moved along the slabline channel and coupled capacitively with the center conductor, to create an amplitude and phase controllable reflection factor. Such tuners have three inherent limitations: (a) they have moving mechanical parts, thus they are relatively slow (tuning time is in the region of seconds); (b) they can only reach typical maximum reflection factor |Γ|≤0.95 at the tuner reference plane, which, transferred to the DUT reference plane, is lower, due to interfering adapter, cable and test fixture insertion loss, and sometimes prohibitory so, i.e. it is not enough to match the DUT.

BRIEF SUMMARY OF THE INVENTION

This invention (FIGS. 4 and 5) discloses a high speed active load and source pull system with mechanical pre-matching capability. The synergy of mechanical pre-matching combined with the electronic (see ref. 5) active feed forward (source) and feedback (load) tuning results in a highly effective hybrid test system with several benefits: a) provides the high tuning speed of the electronic tuners, b) allows the increased tuning range of active tuners and c) enables the reduced amplifier power requirement for feed-forward and -back power due to mechanical pre-matching (see ref. 12). The load pull system allows measuring and optimizing a number of DUT parameters P1, P2, P3 . . .

and/or optimizing either of them. Measuring the parameters for a multitude of impedances allows creating graphically overlapping ISO contours searching for a performance compromise of a number of parameters or searching for a specific optimum of any selected parameter. Combined with high speed calibration routine and numerical search engines, the new tuner system provides a simple and practical solution to the existing limitations of active or passive load and source tuner systems.

To overcome both shortcomings of slide screw tuners (low speed and tuning range limitations) we propose using an active tuner concept based on high speed electronic tuning. Nonetheless, load tuning and source tuning are in their nature different. The RF limitation of load tuning is the reachable tuning range; this can be overcome by adding coherent signal to the signal reflected by the passive tuner <a2> (FIG. 9). This will increase the power wave <a2> and, for constant <b2>, the reflection factor $\Gamma_{Load}$=<a2>/<b2>. In the present application (FIG. 5) this is being done through the active loop comprising coupler SC #4, circulator C #2, the electronic tuner 2, the load amplifier A #2 and the adjustable coupler SC #5. Coupler SC #4 must be fixed, because it is part of the 8-term VNA wave calibration (see refs 7 and 11). This method allows calculating the actual power waves <a1> to <b2> at the reference plan of the DUT.

Source pull has two limitations, one being the reduced reflection factor "seen" by the DUT ($\Gamma_{Source}$=<a1>/<b1>) (FIG. 7), due to adapter and connection insertion loss, as in the case of the load tuner. The other limitation of source pull in a passive tuning system is <a1> itself (FIG. 9): Insertion loss of the input tuner reduces the power available at the DUT input port and may reduce it so much that it is not enough to drive the DUT into the desired operation (saturation) status. In FIGS. 7 and 8 the injected and reflected waves <a0> to <b3> are the signal samples extracted by the couplers and injected into the test ports of the VNA. The 8-term in-situ calibration and power wave measurement method used (see ref. 11) allows calculating the actual injected and reflected power waves at the DUT ports. The actual power waves <a1>, <b1>, <a2>, <b2> used in the calculations of $\Gamma_{Source}$ and $\Gamma_{Load}$ are larger and phase- and amplitude-corrected to their actual values from the shown samples <a0>, <b0>, <a3>, <b3> using the calibration correction coefficients (see ref. 11). Both said limitations of the source pull are overcome using the forward signal coupling technique, shown in FIG. 4; hereby a signal sample is extracted by signal coupler SC #1 and is injected into port 1 of the circulator C #1, reflected by the electronic tuner ET1, amplified and injected back towards the DUT by coupler SC #2, creating this way the forward injection active loop.

DETAILED DESCRIPTION OF THE DRAWINGS

The invention and its mode of operation will be better understood from the following detailed description when read with the appended drawings in which.

DETAILED DESCRIPTION OF THE INVENTION

The test system disclosed in this invention comprises two main components: One is the remotely controlled source and load tuner hardware and the second is the calibration and tuning algorithms and software. Without either the system cannot operate. Other than elsewhere discussed such systems (see ref. 7) herein the source tuning is not dealt with as "another tuner" without further detail. This is because it is known, that full characterization of the DUT (transistor) shall provide information for both load and source impedances, and not only drive the DUT into compression and reveal the optimum load using a 50Ω signal source (including a driver amplifier) alone. Whereas in such conditions (driven hard using a 50Ω source) the load information will be useful, the source impedance is unknown and remains key information for the design of amplifiers. The herein disclosed invention aims to provide both source and load impedance information. And, because the limitations of passive source tuners exclude full source-side matching of many DUT, this invention also includes an active source tuning solution. This is demonstrated in FIG. 4.

Figure 1:
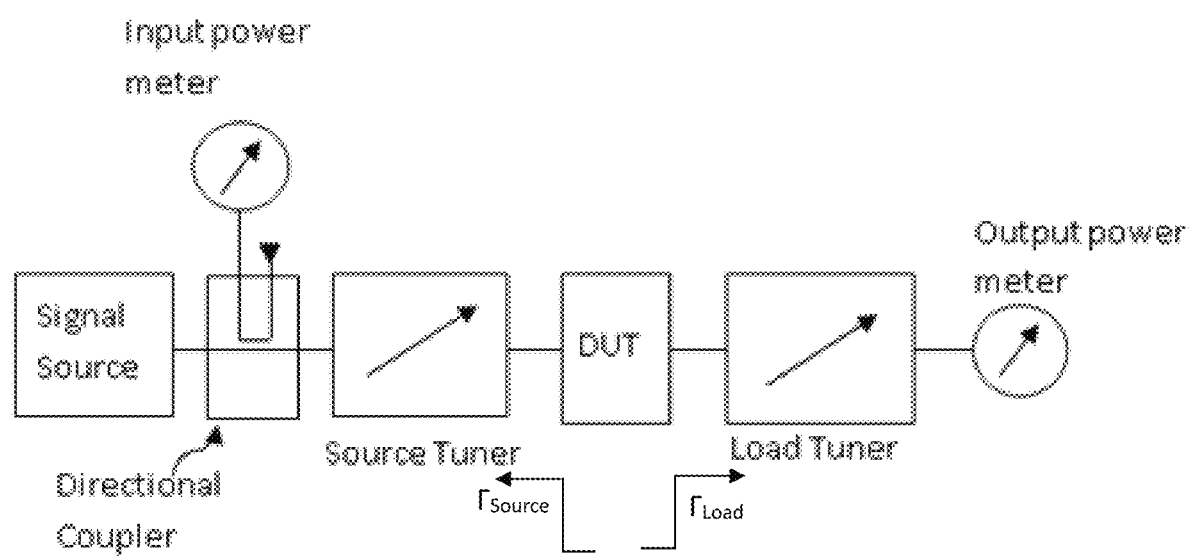
FIG. 1 depicts prior art, a typical load pull test system using passive tuners.
Figure 2:
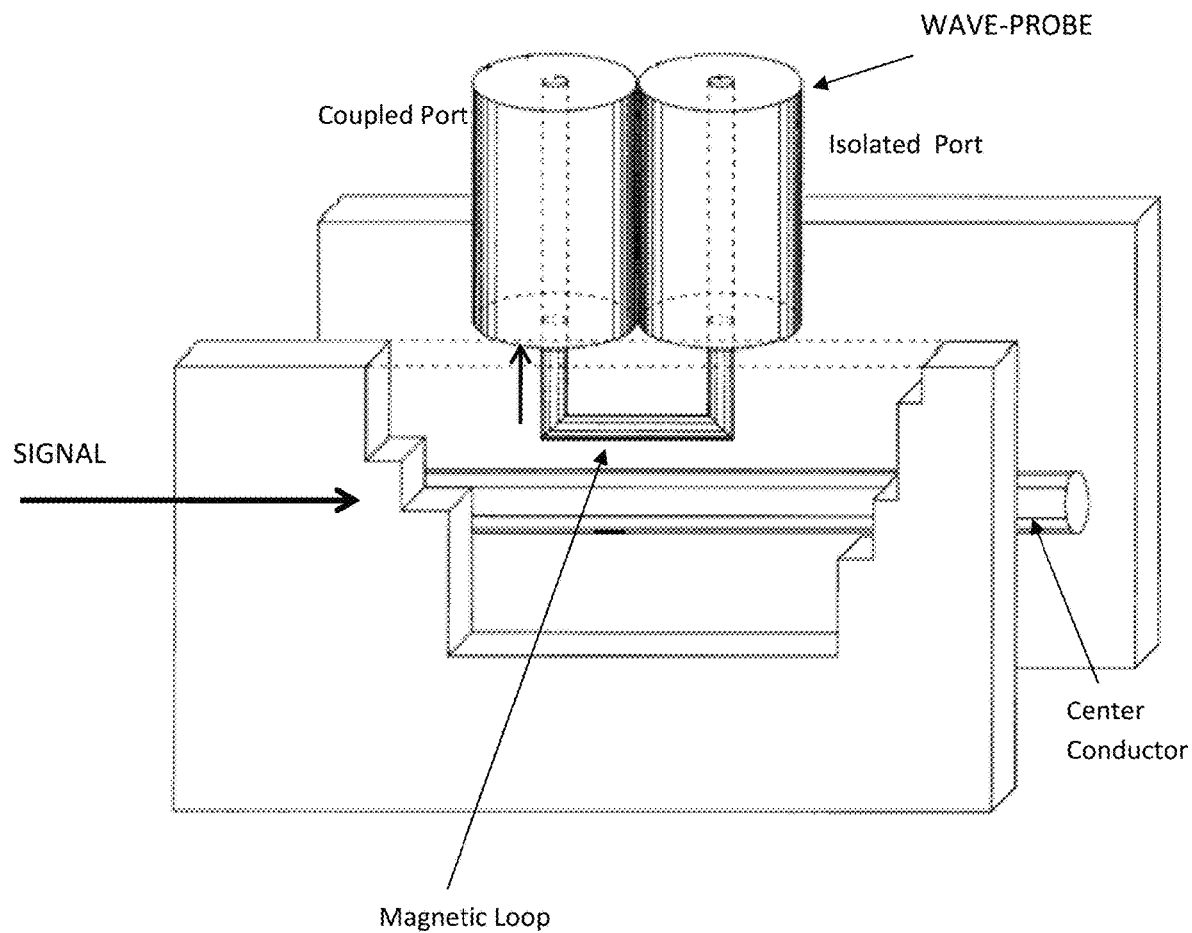
FIG. 2 depicts prior art, the perspective 3D view of a cut through a "wave-probe" type signal coupler.
Figure 3:
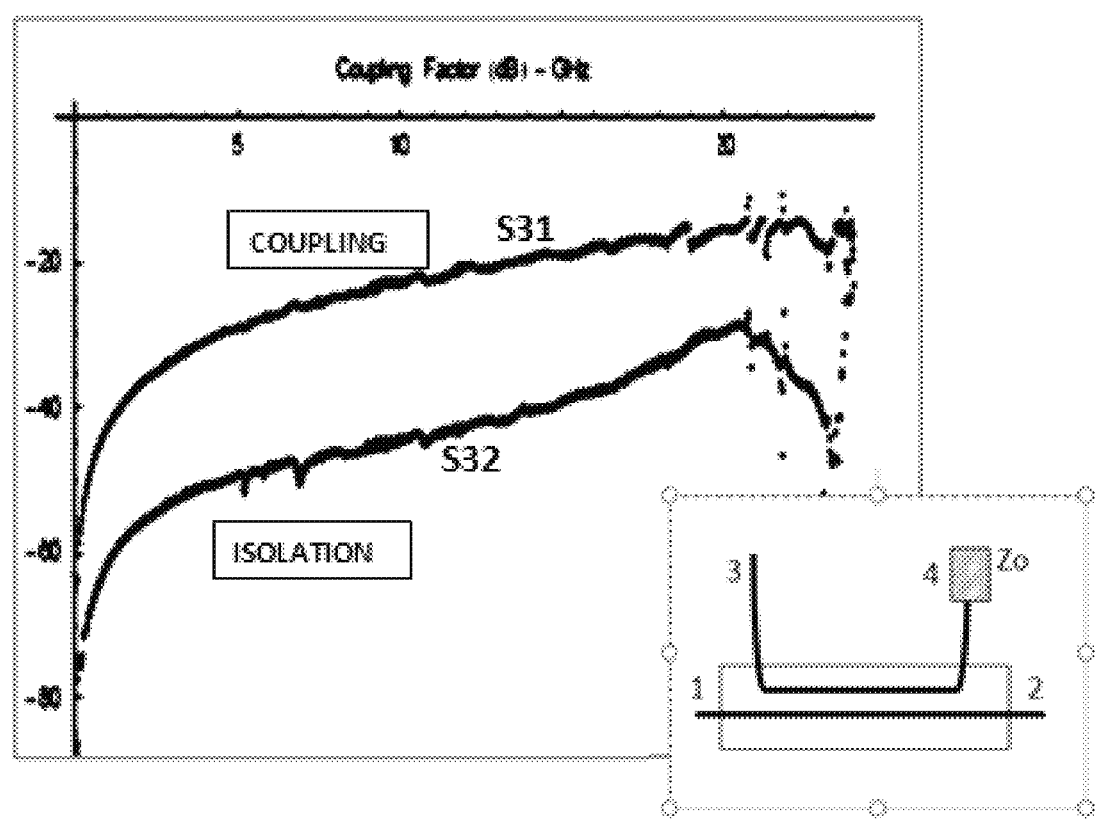
FIG. 3 depicts prior art, measured coupling (S31) and isolation (S32) of a wave-probe and associated port definitions.
Figure 4:
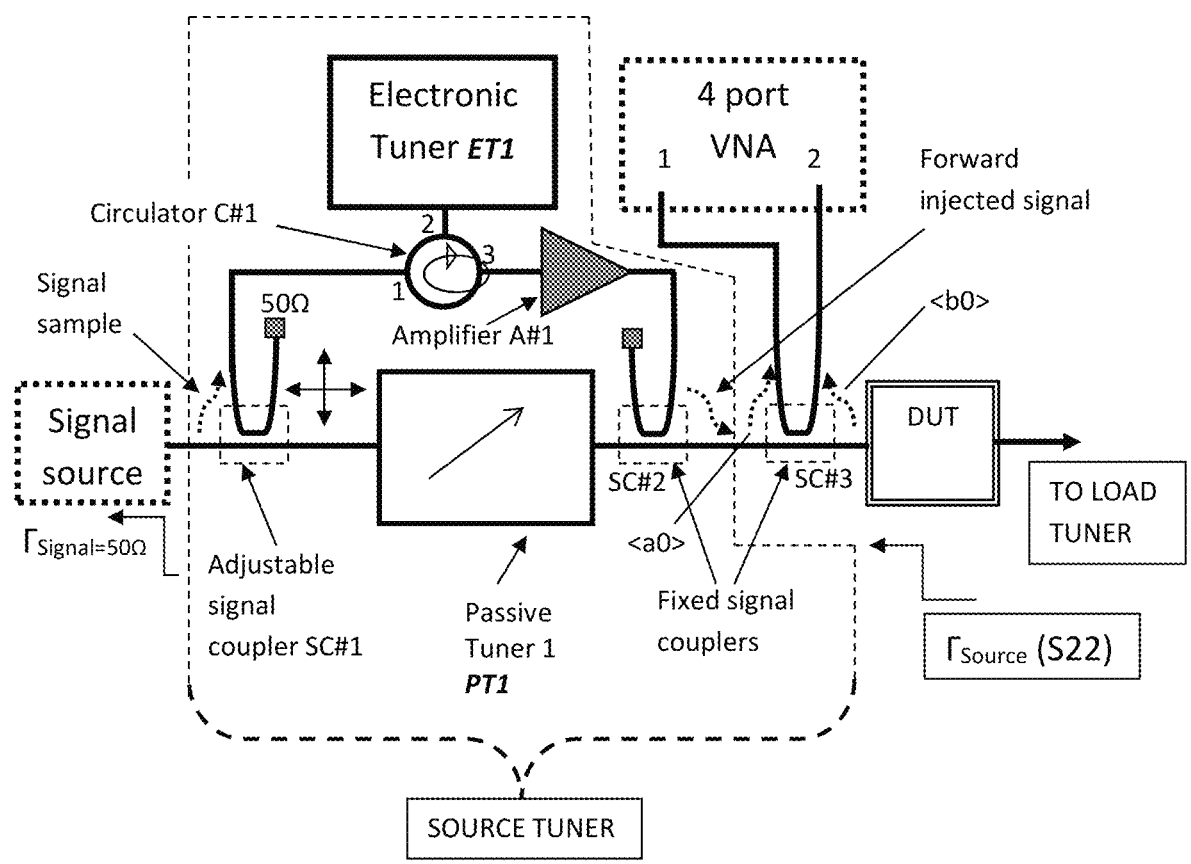
FIG. 4 depicts the block diagram of the electronic/mechanical hybrid source pull measurement system.
Figure 6:
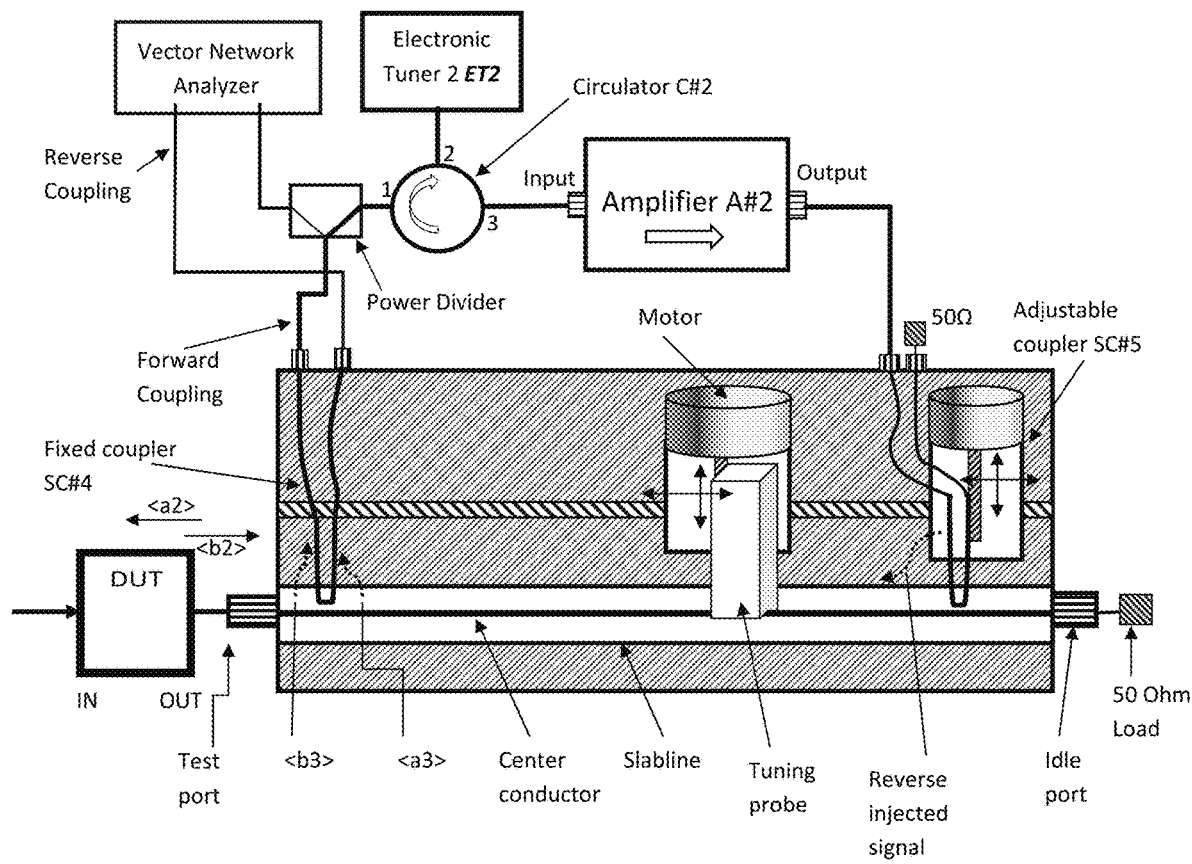
FIG. 6 depicts physical layout of the electronic/mechanical hybrid source pull measurement system.
Figure 7:
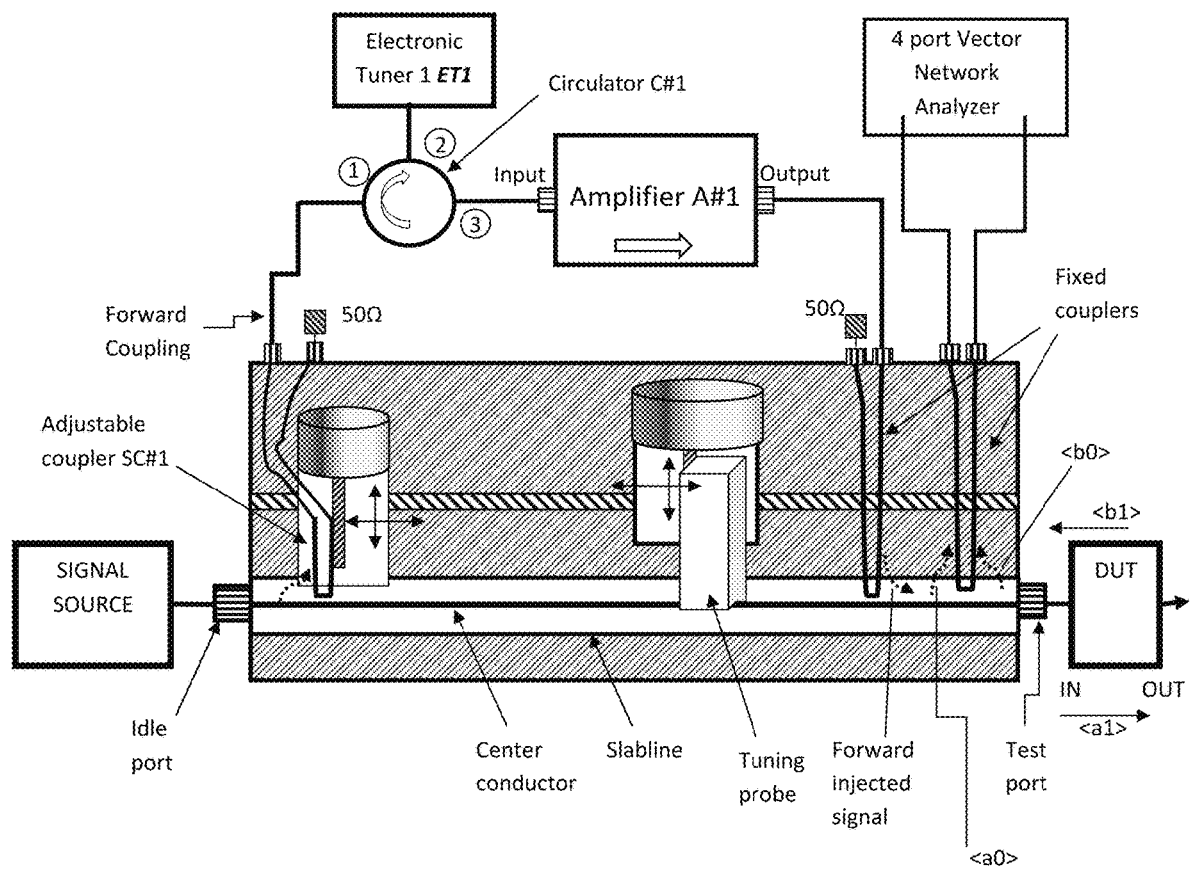
FIG. 7 depicts physical layout of the electronic/mechanical hybrid load pull measurement system.
Figure 10:
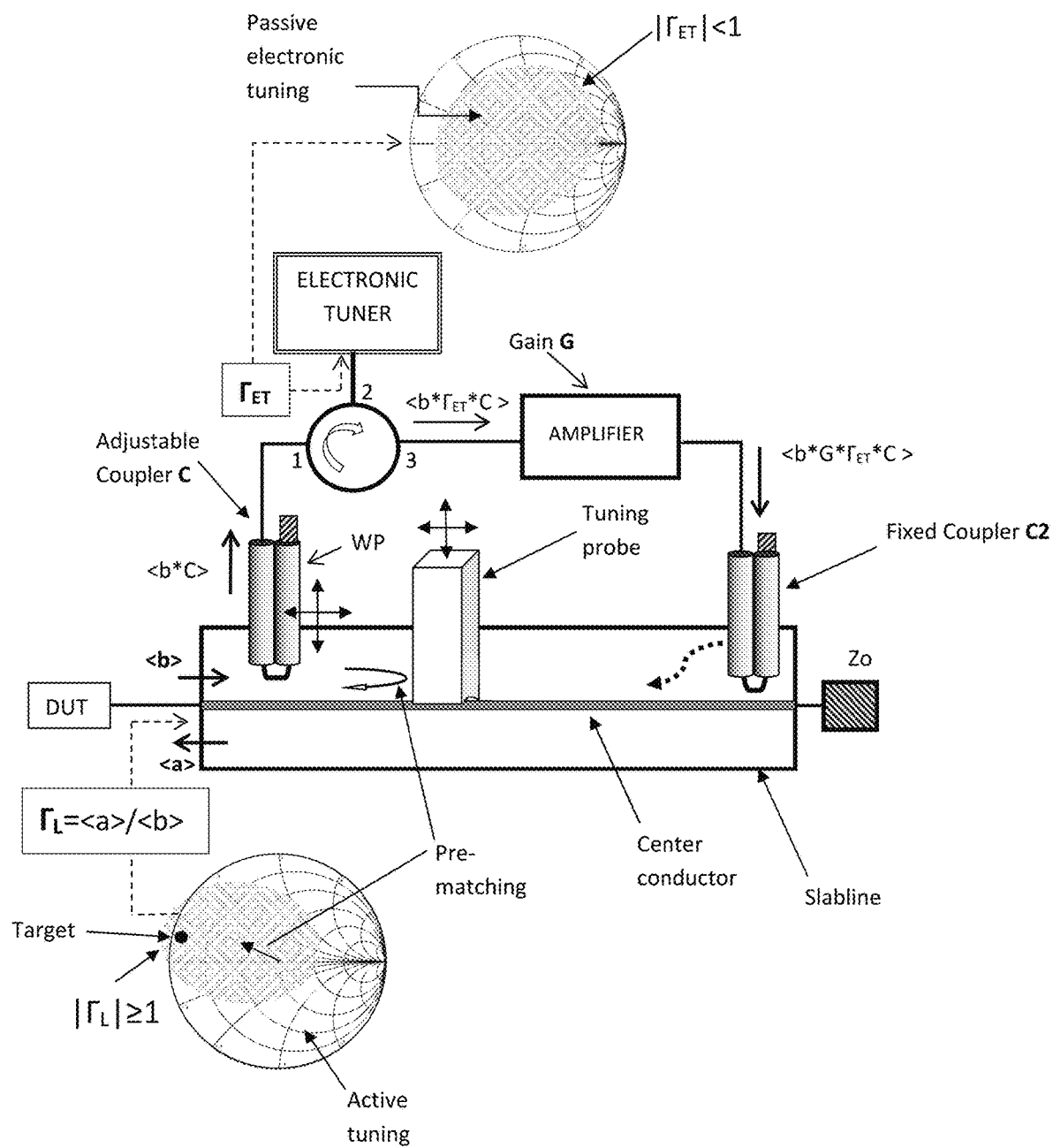
FIG. 10 depicts the complete tuning pattern of an electronic tuner using 10 RF switches (PIN diodes) at the test port reference plane.

In FIG. 4 the source tuner is defined as the area inside the dotted frame surrounding the necessary components made up by the passive tuner 1 (PT1) and the active forward coupled loop comprising the adjustable signal coupler SC #1, the circulator C #1, the digital electronic tuner ET1, the amplifier A #1 and the forward fixed signal coupler SC #2. The signal generated by the Signal source is injected into the slabline (see also FIG. 7 for a more physical representation) through the idle port: the adjustable signal coupler (wave-probe, see ref. 3) SC #1 samples a small portion of the signal and injects it into port 1 of the circulator C #1. The adjustable signal coupler SC #1 is attached on the mobile vertical axis of a horizontally movable carriage (seen in FIG. 7). Inserting the wave-probe (see FIG. 2) deeper into the slabline increases the coupling factor and thus the amount of sampled signal power. Port definitions and typical coupling and isolation data are shown in FIG. 3. Moving the carriage horizontally changes the phase of the sampled signal relative to the idle port. This way there is control of both, the phase and amplitude of the forward injection active loop, consisting of the already mentioned signal coupler SC #1, the circulator C #1, the Electronic Tuner ET1, the amplifier A #1 and the second (fixed) signal coupler SC #2 (shown in FIG. 4) which injects the amplified signal power forward, towards the DUT. The other fixed coupler SC #3 in FIG. 4 is not part of the source tuner; instead, it is part of the measurement system; the 8-term calibration (see ref. 11) allows converting the signals sampled by this coupler <a0> and <b0> into the actual power waves <a1> and <b1> effective at the DUT input port (FIG. 7). The forward injected signal is high speed tuned signal coming from the reflected signal at port 2 of the circulator C #1: each state of the electronic tuner 1 (see FIG. 11) generates an associated impedance at DUT reference plane (see FIG. 10) through the power wave <a1>. The passive tuner (not designated), shown in FIG. 7 in form of a tuning probe, is statically adjusted, both for source (FIG. 7) and load (FIG. 6) tuning, such as to move the center of the tuning area towards the optimum impedance of the DUT: this is called pre-matching (see FIG. 10). In FIG. 10 the fixed signal coupler SC #4 used for sampling the signal and injecting into the VNA for the 8-term wave measurement is not shown, for simplicity, since it is irrelevant to the tuning process itself. The coupling factors of signal couplers SC #x are designated with the letter Cx.

Figure 5:
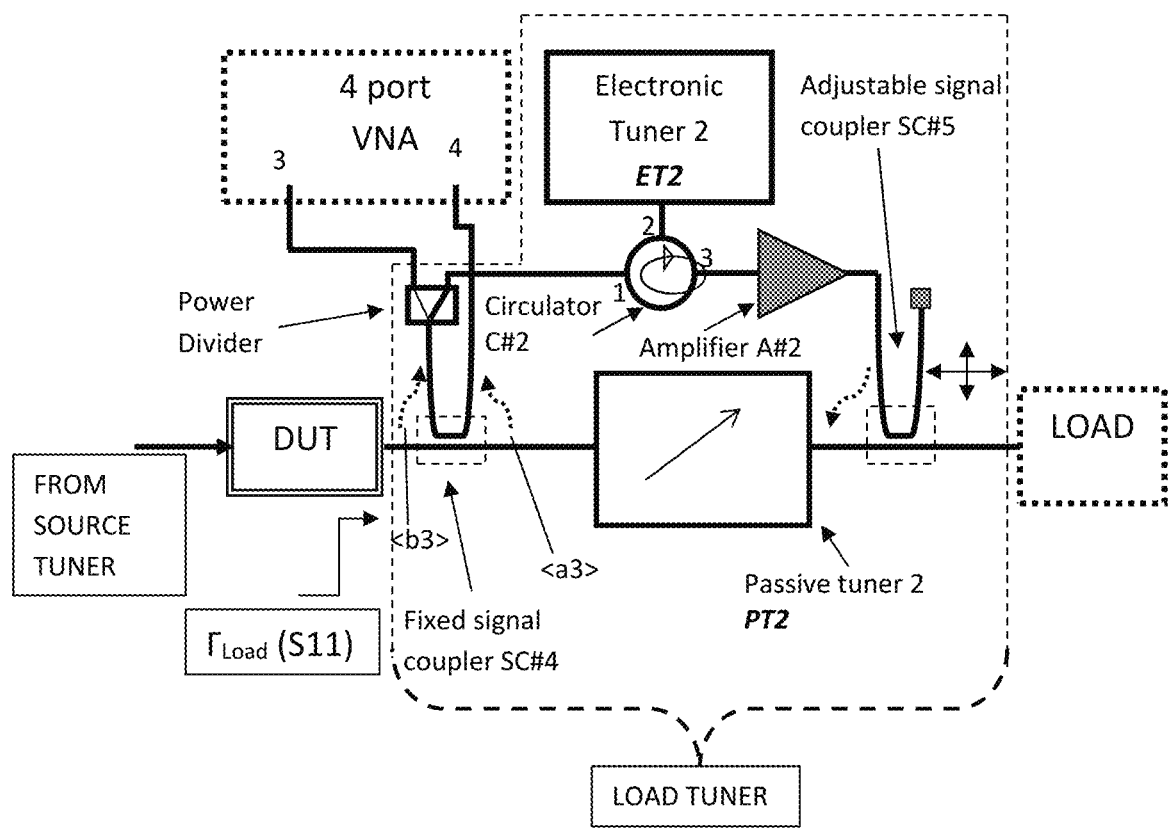
FIG. 5 depicts the block diagram of the electronic/mechanical hybrid load pull measurement system.

In FIG. 5, the load tuner is defined as the area inside the dotted frame surrounding the necessary components made up by the passive tuner 2 (PT2), and the active section. Other than in the source tuner here only two signal couplers (wave-probes) are needed (FIG. 6). This is possible because the signal <b3> sampled by coupler SC #4 is split using a power divider into one portion driving the active loop (circulator C #2, digital electronic tuner 2 (ET2), amplifier A #2 and the adjustable signal coupler SC #5) and the other portion is injected into test port 3 of the VNA (see FIG. 5). The signal <a3> sampled in reverse direction is injected into test port 4 of the VNA. The two sampled signals <a3> and <b3> allow, using the corrections provided by the 8-term calibration (ref. 11) calculating the actual power waves <a2> and <b2> at the DUT output port (FIG. 6) and the load reflection factor $\Gamma_{Load}$=<a2>/<b2>. In the case of the load tuner, the adjustable coupler SC #5 is placed close to the load, to allow for maximum horizontal travel of the carriage of the passive tuner PT2 and ensures full control of the amplitude and phase of the re-injected signal, which travels through the passive tuner (tuning probe) back into the DUT. The passive tuner pre-matches the 50Ω injection system to the DUT and reduces this way the requirement for high output power of amplifier A #2. The electronic tuner 2 reflects the signal back into port 2 of the circulator C #2 and from there into the amplifier, following the mechanism shown in FIG. 10. FIG. 10 also shows, in a generic form, the modifications to the signal propagation: From the entering signal <b> an adjustable portion <C*b> is sampled and injected into port 1 of the circulator. C is the coupling factor of the adjustable coupler. This signal portion is reduced slightly by the transmission factor S21 (≈1) of the circulator between ports 1 and 2, which is close to unity (1), and is reflected by the multitude $2^M$ (M is the number of reflection factor states $\Gamma_{ET}$ of the electronic tuner (<$\Gamma_{ET}$*b*C>) and sent back into port 2 of the circulator. From there, reduced again by S32 (≈1) of the circulator, this signal is injected into the amplifier and exits amplified by the considerable amplifier Gain G: (<G*$\Gamma_{ET}$*b*C>); hereby we assumed S21 and S32 of the circulator to be approximately 1. In fact, they are typically between 0.95 and 0.99 depending on circulator type and frequency. Exact calculations are possible but this will not change the scope of the invention. Subsequently this amplified and tuned signal is injected back into the slabline via the second coupler with an adjustable coupling factor C2, creating a returning signal <G*$\Gamma_{ET}$*b*C*C2> injected backwards through the passive pre-matching tuner into the DUT. Thus the amplitude and phase of the re-injected signal <a2> is controllable statically through the passive tuning and dynamically through the coupling factors C and C2 and the amplifier gain G on top of the reflection factor TET of the electronic tuner and can reach values larger than <b2> and thus a reflection factor |$\Gamma_{Load}$|≥1.

To reach this simplified, though representative, relation we assumed the circulator to be ideal (S21=S32≈1) and spurious couplings into the isolated ports of the wave-probe to be negligible. All this is not exactly true, but it can be neglected for the sake of simplicity. An exact calculation can be carried through but will not alter the scope of the invention. The relations are true and lead to useable results because the amplitudes and phases of the overlapping vectors are easily adjustable. What is important here is the capability of the system to adjust the returning signal by easily adjusting the coupling factor C and pre-tune (pre-matching) to the desired area of the Smith chart using a combination of coupler/active loop phase and then employ fast dynamic electronic tuning TET. This, no hitherto solution can do as effectively, especially not for load and source hybrid tuning simultaneously.

In short, the high speed reflection tuning capability of the electronic tuners ET1 and ET2 are converted into equivalent tuning of transmission tuning, which controls the amplitude and phase of the feed-forward (source tuner) and feed-back (load tuner) active loops, which are superimposed to static passive pre-matching tuning, because all adjustable and fixed signal couplers and passive tuning probes are sharing the same section of a single slabline, the whole resulting into a highly efficient, high speed, low feedback power hybrid load and source pull system.

Even though measurement is performed "in-situ" using the fixed couplers SC #3 (source) and SC #4 (load), a pre-calibration is important in order to be able to direct the system in the desired tuning area of the Smith chart. Whereby active tuner calibration is unreliable, because the amplifier behavior may change during operation, passive tuner calibration for pre-matching is reliable. This will allow starting high speed load or source pull operations already in the desired area of the Smith chart, as shown by the point "Target" and the vector "Pre-matching" pointing approximately in the same direction in FIG. 10. Pre-matching shrinks the impedance cluster of the electronic tuning in size, increases the density of impedance points (see FIG. 14) and populates the area around the passive pre-matching.

Figure 11:
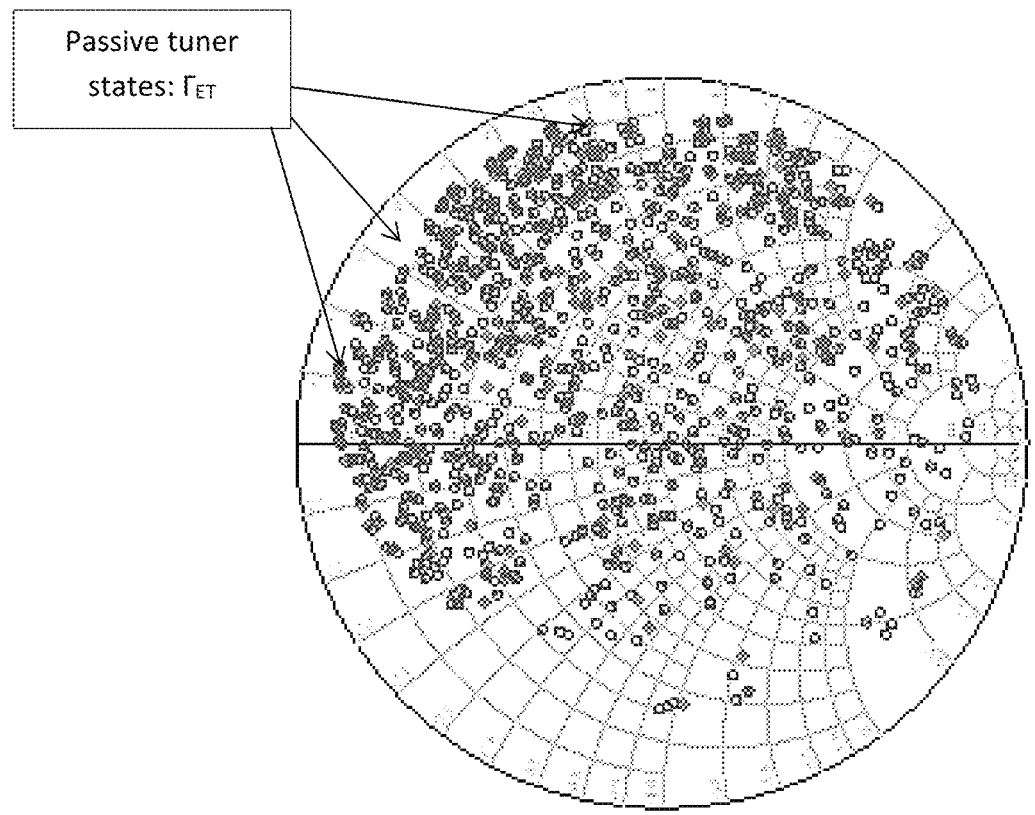
FIG. 11 depicts prior art, typical tuning pattern of electronic RF switch (PIN diode) based tuner using 10 diodes.
Figure 14:
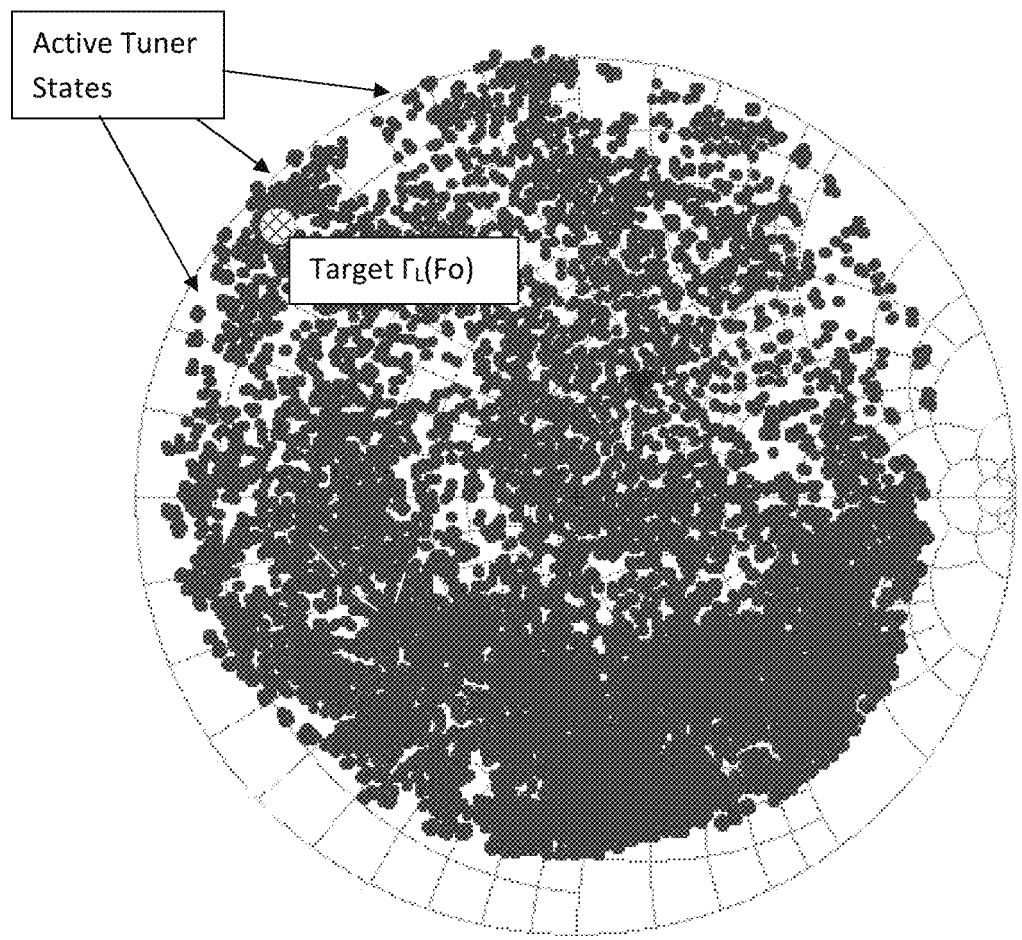
FIG. 14 depicts electronic tuner states of the active tuner at the test port creating reflection factor up to and beyond 1, able to reach the target impedance.

FIG. 11 shows the multitude of tuner states created by the electronic tuner. The electronic tuner uses RF switches, typically PIN diodes (see ref. 8), and is digital. It can generate N=$2^M$ distinct tuner states (impedances) at any given frequency, assuming it comprises M diodes. PIN diodes are the preferred choice, even though variable capacitors (Varactors, see ref. 9) or MEMS (see ref. 10) are possible. The RF switches (PIN diodes) are connected parallel to each-other, at selected distances, between the transmission line and ground. When biased positive they represent a near SHORT circuit to ground, they are switched ON. When they are biased negative they represent a near OPEN circuit, they are switched OFF. When all diodes are OFF the electronic tuner represents approximately a 50 Ohm transmission line between its input and output ports; when terminated with 50 Ohms the electronic tuner does not reflect any signal injected into its input port: In the configuration of FIGS. 4 and 5 the signal flow stops at the circulator, because the signal traverses the electronic tuner and is absorbed by the 50 Ohm load: the active loop is idle, no signal traverses the circulator from port 1 to port 3 and nothing is injected into the slabline, neither for- or backwards. Switching M RF switches (diodes) alternatively or combined from OFF to ON state creates a maximum number $N=2^M$ of possible combinations. The reflection factors on FIG. 11, generated this way by the electronic tuner, are neither regular nor uniformly distributed. Neither is tuning between the points possible. It is impossible to interpolate between those points. To be able to reach very accurately any arbitrary impedance on the Smith chart we simply need a high number of states, such as shown in FIG. 14. As an example, electronic tuners with 10 RF switches (creating 1024 states each) can be cascaded. Two cascaded units create $1024^2 \approx 1$ million states, three cascaded units create approximately 1 billion states. Direct full calibration is impossible, because of the required time; fast calibration is possible if we use a segmented technique, whereby each group of RF switches is calibrated separately and the result is cascaded in memory to create the totality of permutation states; for instance each 10-RF switch unit is calibrated separately for all 1024 permutations and then the s-parameters of the combined permutations are cascaded in memory.

Figure 12:
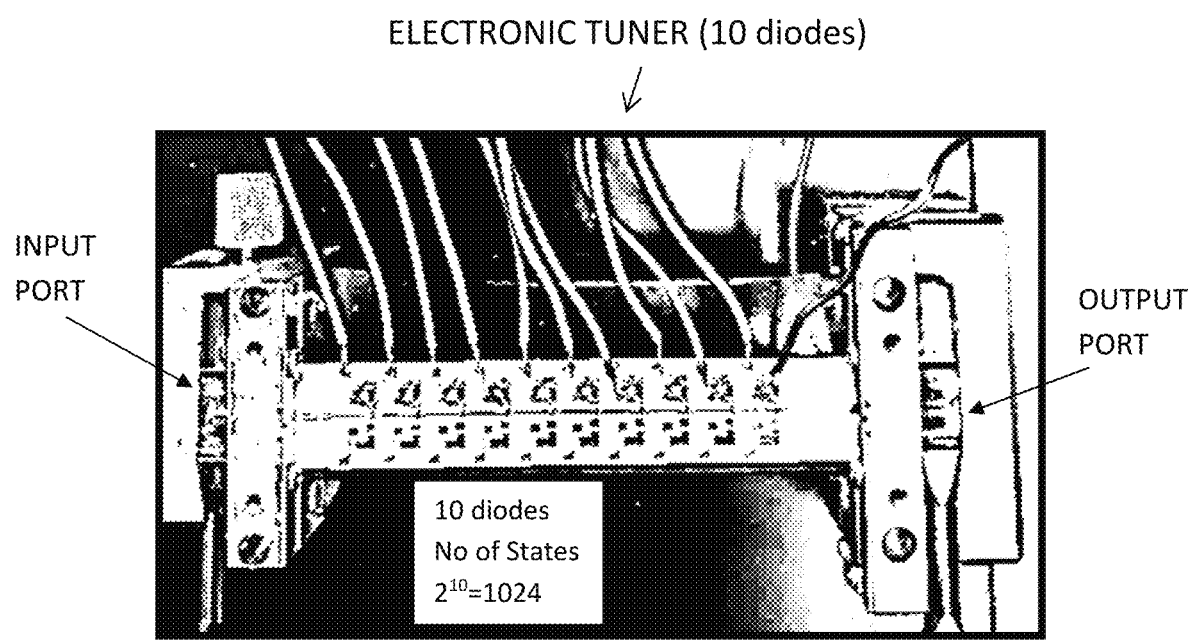
FIG. 12 depicts tuning states of electronic tuner using 10 diodes creating $2^{10}$=1024 tuner states (impedances).
Figure 13:
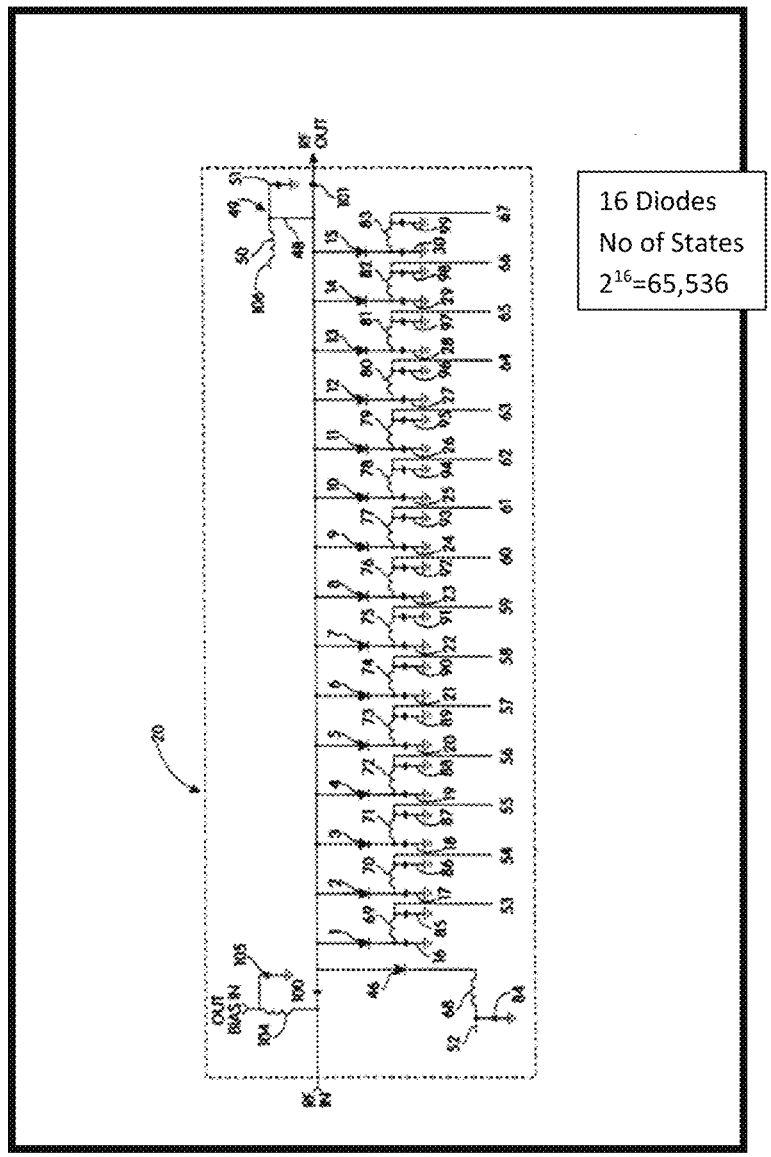
FIG. 13 depicts prior art, schematics using 16 diodes creating $M=2^{16}$=65,536 tuner states (impedances).

FIG. 12 is a photograph of a prototype electronic tuner, manufactured based on an invention of the early nineties (see ref. 4), the schematics of which is shown on FIG. 13. FIG. 10 depicts the basic concept of the active tuner segregated in active tuning unit and transmission slabline with a basic indication of signal flow.

Figure 15:
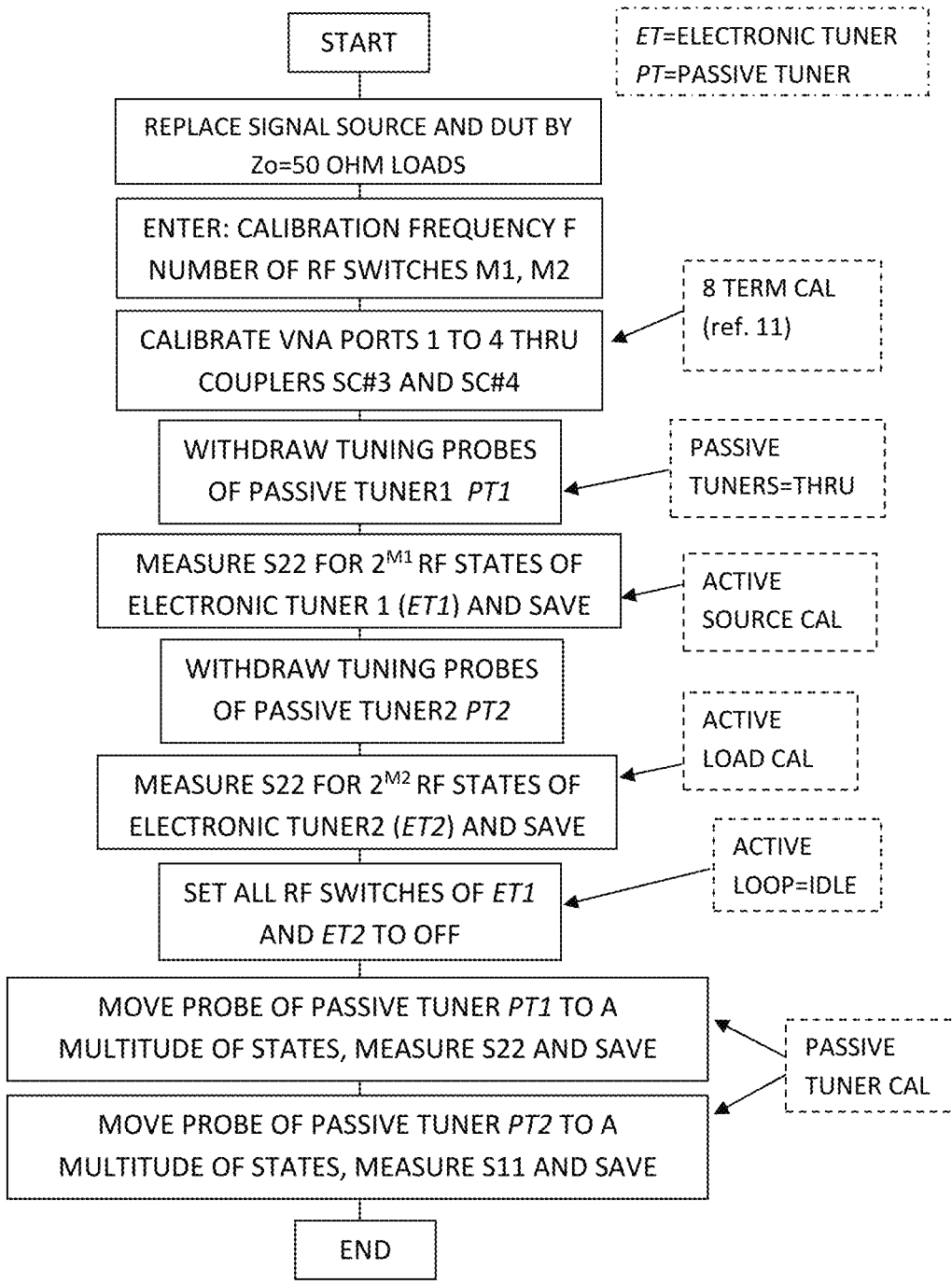
FIG. 15 depicts the flow chart of calibration method.

Active tuners can be pre-calibrated, (FIG. 15) but the reliability and validity of the calibration depends on operating conditions, in particular the power generated by the DUT, since it may drive the feedback amplifier into compression and affect its gain and transmission phase and, by consequence, the phase and amplitude of the feed-forward and -back power. If the amplifier is driven too hard into saturation and the impedances drift significantly, the tuning may be lost. A pre-calibration is therefore necessary and useful only to pre-tune, i.e. bring the system close to the target test conditions. In active load/source pull systems the actual impedance seen by the DUT must be measured "in situ", as shown in FIG. 5. In the setup of FIG. 5 the injected signal is sampled by the input signal coupler: Power wave <a1> goes into the DUT and power wave <b1> is reflected. Equivalent at the output, power wave <b2> is extracted from the DUT and <a2> injected back, creating the load reflection factor <a2>/<b2>. The active tuner retrieves a portion of <b2>, phase-adjusts and amplifies it via the wave-probe and the electronic tuner in the active loop and injects it back through the pre-matching output tuner.

Figure 8:
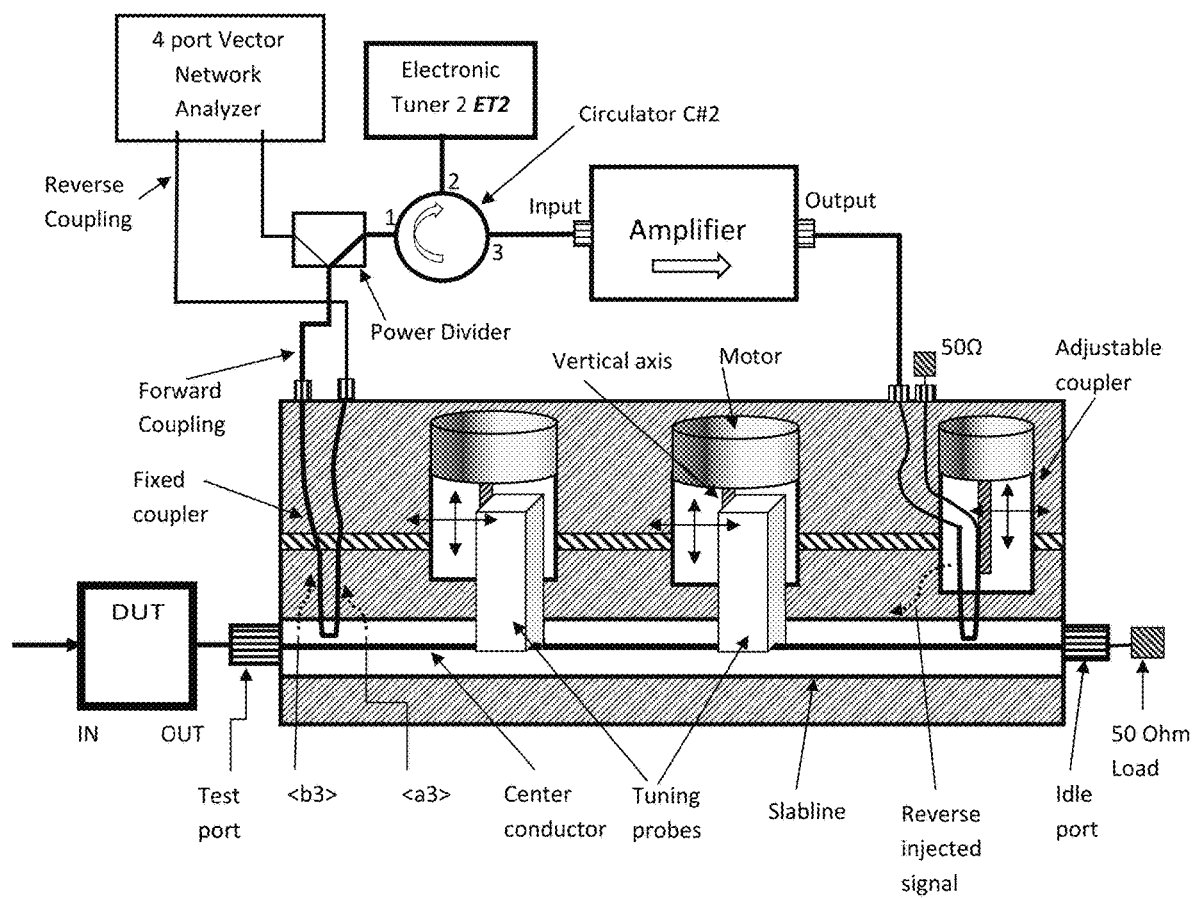
FIG. 8 depicts physical layout of the electronic/mechanical hybrid load pull measurement system using two-probe electro-mechanical pre-matching tuner.
Figure 9:
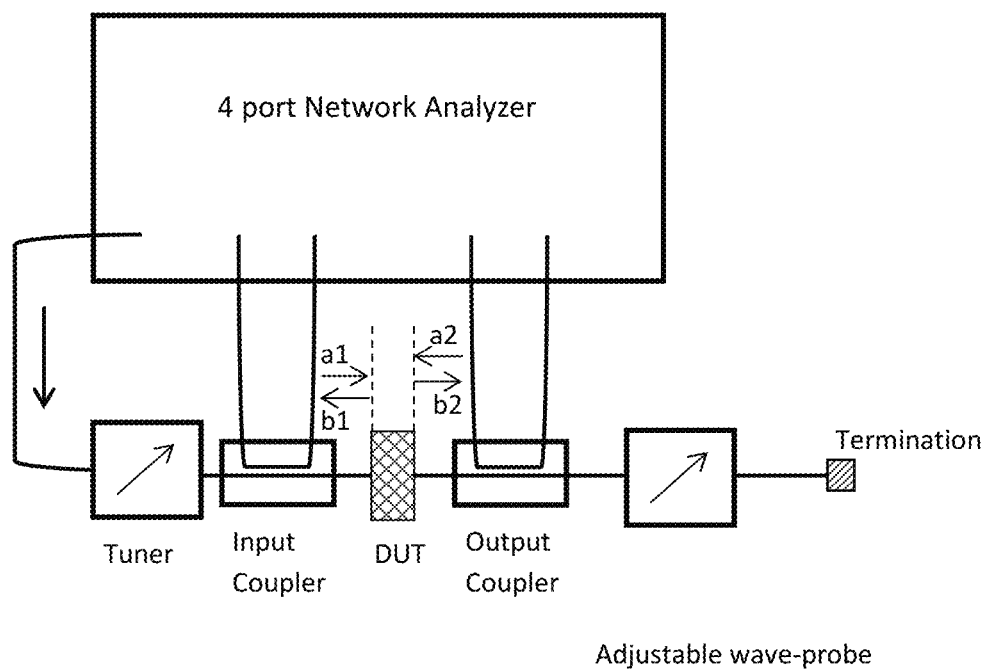
FIG. 9 depicts prior art, the concept of a passive load pull system with in-situ wave measurement and four-port vector network analyzer.

The output passive tuner can be harmonic (see FIG. 8). In this case two (or more) wideband tuning probes allow independent harmonic tuning (see ref. 13). In this case we have a source/load pull hybrid system at the fundamental frequency Fo and passive harmonic tuning at one or more harmonic frequencies.

Calibration executes per the following steps (FIG. 15): (a) The signal source and DUT are replaced by 50 Ohm loads, i.e. both source and load tuners are terminated on their test and idle ports by the characteristic impedance Zo. After defining the calibration frequency or frequencies and the number of RF switches (PIN diodes) of the electronic tuners M1 and M2 in step (b) we execute the 8-term VNA calibration via the fixed couplers SC #3 and SC #4, referred to the DUT ports see ref. 11). In the next step (c) we calibrate the electronic tuners. For that we first withdraw the tuning probes of the passive tuners to create a through line and measure only the reflection factors S22 of the input tuner and S11 of the output tuner at the ports, where the DUT is normally attached. We execute S11 and S22 measurements for all N permutations of either electronic tuner. Once the electronic tuner calibration is terminated and saved, we set all RF switches (PIN diodes) to OFF to stop the signal coming out of the circulators and thus any active injection power. Then, in step (d), we calibrate the passive tuners by placing the tuning probes in a multitude of positions covering the Smith chart within the tuning range and save again S22 for passive tuner 1 and S22 for passive tuner 2 ET2. If more than one probe is present we use the de-embedding calibration technique (see ref. 13).

Figure 16:
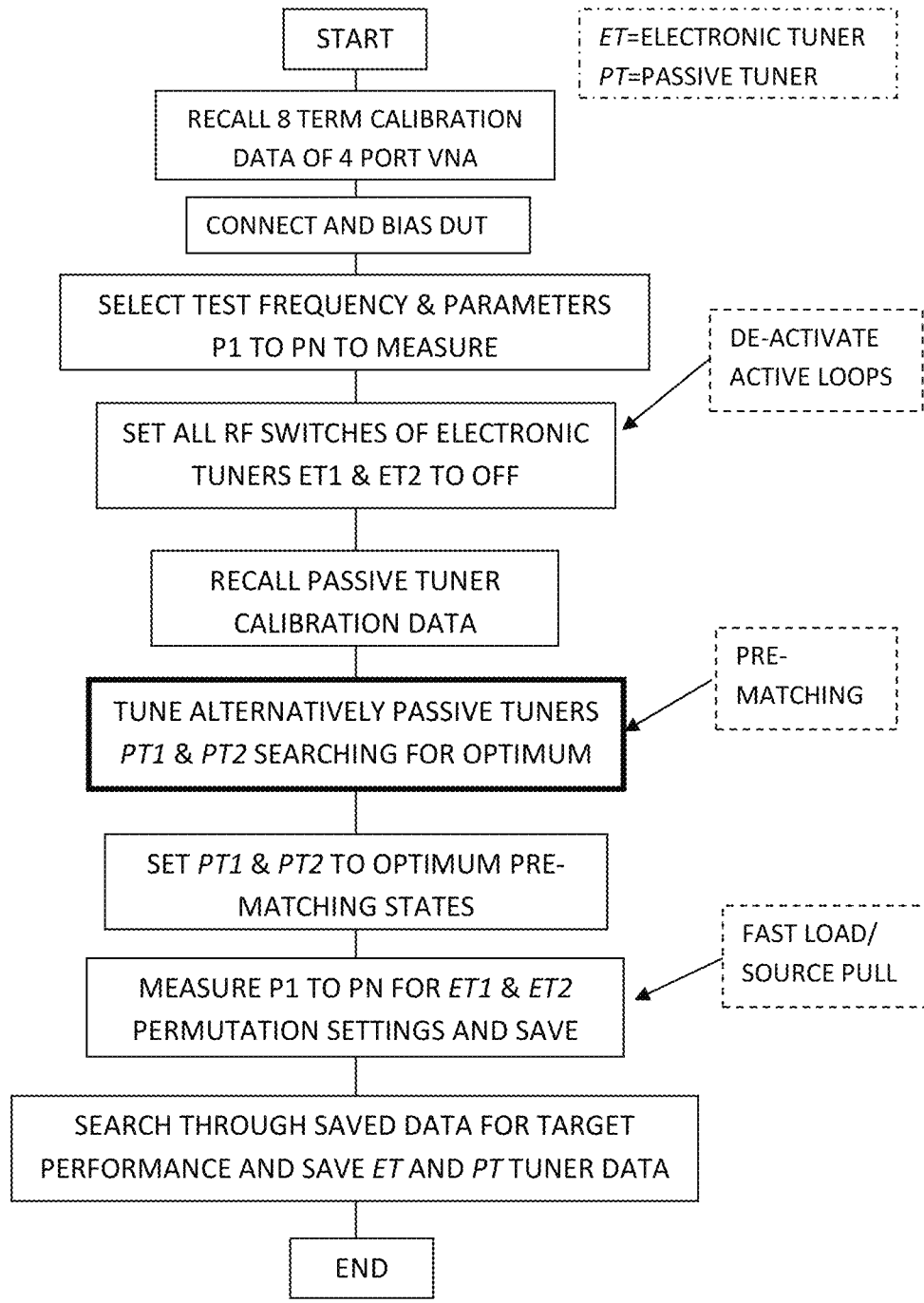
FIG. 16 depicts the flow chart of tuning and load/source pull method.

Actual tuning is either "Peak-search" or full load/source pull (FIG. 16). Normally one uses the peak-search method on the source side and full load pull on the load side of the DUT. Systematic peak search is possible only using passive tuners, because the tuning behavior is smooth and follows simple rules (deepening the probe into the slabline increases the amplitude, moving the probe along the slabline controls the phase, see ref. 2). The electronic tuner creates randomly jumping active reflection factors, meaning that intelligent, gradient based, peak-search is rather impossible. Instead, the tuning speed of electronic tuners allows collecting data for a multitude of tuning states and search for an optimum numerically through the data. ISO contour creation is only possible if a contiguous area of the Smith chart is covered. This is done here in the second step, i.e. load pull, allowing the creation of large load pull files and graphical processing the data numerically. Using fast active tuning on the source side shall be restricted in a small area around the tip of the passive pre-matching source vector for a fast optimum determination.

This application discloses the concept of a high speed active source and load pull tuning system with passive pre-matching capability. Obvious alternatives shall not impede on the originality of the concept.

What I claim as my invention is:

1. A load pull tuner system comprising: a hybrid source impedance tuner, having a test port and an idle port, and including an active feed-forward digital electronic impedance tuner, and an integrated passive pre-matching impedance tuner; and a hybrid load impedance tuner, having a test port and an idle port, and including an active feed-back digital electronic impedance tuner, and an integrated passive pre-matching impedance tuner, and a pre-calibrated four port vector network analyzer (VNA); wherein the test port of the hybrid source impedance tuner is connected to an input port of a DUT, and the test port of the hybrid load impedance tuner is connected to an output port of the DUT.

2. The load pull tuner system as in claim 1, wherein i) the active feed-forward digital electronic tuner of the hybrid source impedance tuner includes: a slotted airline (slabline) having a center conductor between a test port and an idle port; an adjustable signal coupler SC #1 having a coupled and an isolated port; one circulator C #1 having ports 1, 2 and 3; a digital electronic impedance tuner ET #1 including a multitude M1 of independently controlled RF switches; an amplifier A #1 having input port and output port; two fixed signal couplers SC #2 and SC #3; associated RE cables and characteristic impedance Zo loads; ii) the integrated passive pre-matching tuner of the hybrid source impedance tuner comprises: a slide screw tuner sharing the same slabline as the signal couplers of the active feed-forward digital electronic tuner, and having at least one wideband reflective tuning probe, insertable into a slot of the slabline, capacitively coupled with the center conductor and movable along and perpendicularly to the center conductor of the slabline; and wherein the adjustable signal coupler SC #1 is an electro-magnetic wire loop (wave-probe) insertable into a slot of the slabline and movable along a longitudinal axis of the slabline between the idle port of the slabline and the at least one reflective tuning probe, and wherein the fixed signal couplers SC #2 and SC #3 are electro-magnetic wire loops (wave-probes) mounted on the slabline between the test port and the at least one reflective tuning probe; wherein signal coupler SC #3 is mounted closest to the test port; the coupled port of signal coupler SC #1 is connected with port 1 of circulator C #1; port 2 of circulator C #1 is connected with the digital electronic impedance tuner ET #1; port 3 of circulator C #1 is connected with the input port of the amplifier A #1; the output port of amplifier A #1 is connected with the forward coupled port of signal coupler SC #2; the forward and reverse coupled ports of signal coupler SC #3 are connected with test ports 1 and 2 of the VNA and the isolated ports of signal couplers SC #1 and SC #2 are terminated with characteristic impedance Zo.

3. The load pull tuner system as claim 2, wherein the characteristic impedance Zo is equal to 50 Ohms.

4. The load pull tuner system as in claim 1, wherein i) the active feed-back digital electronic tuner of the hybrid load impedance tuner comprises: a slotted airline (slabline) having a center conductor between a test port and an idle port, a fixed signal coupler SC #4 being an electro-magnetic wire loop (wave-probe) and having a forward and a reverse coupled port, a power divider having one input and two output ports, a circulator C #2 having ports 1, 2 and 3, a digital electronic impedance tuner ET #2 including a multitude M2 of independently controlled RF switches, an amplifier A #2 having input port and output port, an adjustable signal coupler SC #5 being an electro-magnetic wire loop (wave-probe), RF cables and characteristic impedance Zo loads, and wherein ii) the integrated passive pre-matching tuner of the hybrid load impedance tuner comprises: a slide screw impedance tuner, sharing the same slabline as the signal couplers SC #4 and SC #5 of the active digital feedback electronic tuner and having at least one wideband reflective tuning probe insertable into a slot of the slabline, capacitively coupled with the center conductor and movable along and perpendicularly to the center conductor of the slabline; wherein the fixed signal coupler SC #4 is an electro-magnetic wire loop (wave probe), said signal coupler SC #5 is an electro-magnetic wire loop (wave-probe) insertable into the slot of the slabline and movable along a longitudinal axis of the slabline between the idle port of the slabline and the at least one reflective tuning probe; and wherein the forward coupled port of signal coupler SC #4 is connected with the input port of the power divider, one output port of the power divider is connected with port 1 of the circulator C #2, the other output port of the power divider is connected with test port 3 of the VNA; the reverse coupled port of signal coupler SC #4 is connected with test port 4 of the VNA; port 2 of circulator C #2 is connected with the electronic tuner; port 3 of circulator C #2 is connected with the input port of the amplifier; the output port of the amplifier is connected with the reverse coupled port of signal coupler SC #5; the forward coupled port of signal coupler SC #5 is terminated with Zo.

5. The load pull tuner system as in claim 1, wherein the integrated passive pre-matching tuner of the hybrid load impedance tuner includes at least two independently movable wideband reflective tuning probes.

* * * * *